(12) United States Patent
Colineau et al.

(10) Patent No.: US 11,002,363 B2
(45) Date of Patent: *May 11, 2021

(54) SEAL

(71) Applicant: Carl Freudenberg KG, Weinheim (DE)

(72) Inventors: Francois Colineau, Weinheim (DE); Jens Hofmann, Mannheim (DE); Thomas Klenk, Dossenheim (DE)

(73) Assignee: CARL FREUDENBERG KG, Weinheim (DE)

( * ) Notice: Subject to any disclaimer, the term of this patent is extended or adjusted under 35 U.S.C. 154(b) by 94 days.

This patent is subject to a terminal disclaimer.

(21) Appl. No.: 16/273,167

(22) Filed: Feb. 12, 2019

(65) Prior Publication Data
US 2019/0277404 A1 Sep. 12, 2019

(30) Foreign Application Priority Data
Mar. 8, 2018 (DE) ............... 10 2018 105 375.4

(51) Int. Cl.
| *F16J 15/3284* | (2016.01) |
| *F16J 15/00* | (2006.01) |
| *F16J 15/3204* | (2016.01) |
| *F16J 15/06* | (2006.01) |
| *H05K 9/00* | (2006.01) |

(52) U.S. Cl.
CPC ......... *F16J 15/3284* (2013.01); *F16J 15/002* (2013.01); *F16J 15/064* (2013.01); *F16J 15/3204* (2013.01); *H05K 9/0081* (2013.01)

(58) Field of Classification Search
CPC ...... F16J 15/3284; F16J 15/3268; F16J 15/00; F16J 15/002; F16J 15/162; F16J 15/40; F16J 15/064; F16J 15/06; F16J 15/3204; F16J 15/3444; H05K 9/0081; H05K 9/0003; H05K 9/0073; H05K 9/0075; H05K 9/0083; H05K 9/0086
USPC ........................................ 277/438
See application file for complete search history.

(56) References Cited

U.S. PATENT DOCUMENTS

| 10,161,522 B2 | 12/2018 | Colineau et al. | |
| 10,190,690 B2 | 1/2019 | Colineau et al. | |
| 2010/0276894 A1* | 11/2010 | Jin | B60L 50/00 277/500 |
| 2011/0072634 A1* | 3/2011 | Kamibayashiyama | F16J 15/061 29/446 |
| 2014/0203514 A1* | 7/2014 | Colineau | F16J 15/3232 277/353 |

(Continued)

FOREIGN PATENT DOCUMENTS

| DE | 2621352 A1 | 12/1977 |
| DE | 102010018270 A1 | 12/2010 |

(Continued)

*Primary Examiner* — Nathan Cumar
(74) *Attorney, Agent, or Firm* — Leydig, Voit & Mayer, Ltd.

(57) ABSTRACT

A seal includes: a sealing ring made of a sealing material; and at least one shielding ring made a soft magnetic material for shielding against electromagnetic interfering waves. In an embodiment, the at least one shielding ring is formed by a ferrite ring. In an embodiment, the at least one shielding ring includes at least two shielding rings, the at least two shielding rings being arranged in a functional series connection.

6 Claims, 3 Drawing Sheets

(56) References Cited

U.S. PATENT DOCUMENTS

2016/0010750 A1\* 1/2016 Colineau .............. F16J 15/3268
277/565

FOREIGN PATENT DOCUMENTS

| DE | 102013000982 A1 | 7/2014 |
|----|-----------------|--------|
| DE | 102014010269 A1 | 1/2016 |
| FR | 2446971 A1 | 8/1980 |
| JP | 2014207822 A | 10/2014 |

\* cited by examiner

SEAL

CROSS-REFERENCE TO PRIOR APPLICATION

Priority is claimed to German Patent Application No. 10 2018 105 375.4, filed on Mar. 8, 2018, the entire disclosure of which is hereby incorporated by reference herein.

FIELD

The invention relates to a seal, comprising a sealing ring made of a sealing material.

BACKGROUND

Such a seal is generally known, wherein the sealing ring is, for example, designed as a radial shaft sealing ring and consists of an elastomer material. The sealing ring has at least one dynamically-stressed sealing lip which encloses in a sealing manner a surface to be sealed of a machine element to be sealed under elastic preload.

From DE 10 2013 000 982 A1 is known a seal comprising a sealing ring, having at least one dynamically-stressed sealing lip, and a ballast seal. The ballast seal is arranged at an axial distance to be adjacent to the sealing lip and consists of an electrically-conductive material. The sealing lip and the ballast seal enclose in a sealed manner a surface to be sealed of a first machine element to be sealed, wherein the first machine element is arranged at a radial distance to be adjacent to a second machine element. The sealing ring and the ballast seal are arranged in the gap formed by the radial distance. The second machine element is grounded to a defined ground potential, wherein the first and second machine elements are respectively contacted adjacently by the ballast seal and are thereby electrically-conductively connected to one another.

The ballast seal is formed as a potential equalization ring and consists, for example, of an electrically-conductive, non-woven fabric impregnated with PTFE. Mechanical damage to the machine elements due to an electrical voltage breakdown is, consequently, ruled out. Without the electrical potential equalization, mechanical damage to the machine elements to be sealed against one another could occur as a result of electrical potentials, differing in size, of the machine elements being equalized by an electrical voltage breakdown. Such a voltage breakdown is more likely the more closely adjacent the machine elements with different electrical potentials are assigned to one another. A voltage breakdown can cause a material removal at the machine element with a relatively lower charge and a change in the material structure in the region in which the voltage breakdown takes place. An effective shielding against electromagnetic interfering waves—in particular, an effective shielding against electromagnetic interfering waves with a frequency ≥30 MHz—is not possible by means of the potential equalization element.

DE 10 2014 010 269 A1 discloses a further ballast seal. The ballast seal comprises a substantially annular disk made of an electrically-conductive and air-permeable material and a supporting body, wherein the disk is designed as a separately-produced individual part with respect to the supporting body and is connected to the supporting body.

The supporting body can be formed by a sealing ring.

The ballast seal has not only the task of potential equalization, but also the task of preventing contaminants from the environment from penetrating to the sealing lip of the sealing ring.

The ballast seal is a decoupled electrical bridge. The term, "decoupled," is understood in this context to mean that the sealing function of, for example, a sealing ring combined with the ballast seal is decoupled from the function of the electrical bridge, viz., to avoid a voltage breakdown and to bring about an electrical potential equalization between machine elements.

The ballast seal is not in direct contact with the medium to be sealed. In this case, it is advantageous that the electrical resistance of the ballast seal is substantially constant during the entire service life of the ballast seal. If the ballast seal were to come into contact with the medium to be sealed, the resistance would change unpredictably.

DE 10 2010 018 270 A1 discloses an electrically-conductive sealing arrangement which is used in hybrid and electric vehicles. The electrically-conductive sealing arrangement shall prevent distributed RF energy from leading to undesired interferences—for example, to interferences of a radio in a motor vehicle. These unwanted interferences are to be prevented by the sealing ring consisting of an electrically-conductive material and being electrically-conductively arranged between a shaft to be sealed and a housing.

Generally, the aforementioned electrically-conductive materials are not well suited for satisfactorily shielding against electromagnetic interfering waves—particularly when the sealing ring is used in connection with e-mobility and the electromagnetic interfering waves therefore have a frequency which is often ≥30 MHz.

SUMMARY

In an embodiment, the present invention provides a seal, comprising: a sealing ring comprising a sealing material; and at least one shielding ring comprising a soft magnetic material configured to shield against electromagnetic interfering waves.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
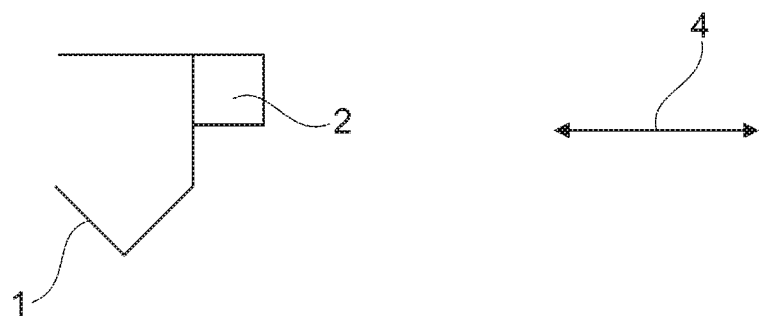
FIG. 1 a first exemplary embodiment of a seal, comprising the sealing ring 1 and the shielding ring 2, FIG. 2 a second exemplary embodiment, wherein, in addition to the exemplary embodiment of FIG. 1, a potential equalization ring is used, FIG. 3 a third exemplary embodiment similar to the exemplary embodiments of FIGS. 1 and 2, wherein a total of three shielding rings are used, which are functionally connected in series.

In an embodiment, an aim of the invention is to further develop a seal of the type mentioned at the outset in such a way that it has further functions in addition to the sealing function and can therefore be used to particular advantage in the technical field of e-mobility. In particular, by means of the ballast seal, electromagnetic interfering waves with a frequency ≥30 MHz are able to be effectively shielded against.

In order to achieve the aim, a seal is provided, which comprises a sealing ring made of a sealing material and at least one shielding ring made of a soft magnetic material for shielding against electromagnetic interfering waves.

In comparison to electrically-conductive, non-woven fabrics or electrically-conductive polymers, soft magnetic materials bring about a stronger shielding as a result of higher volume proportions of shielding-relevant material components. As stated above, it has been found that potential equalization rings, which must necessarily consist of an electrically-conductive material in order to fulfill their function, are not well suited for effectively shielding against electromagnetic interfering waves. In particular, only then, when the electromagnetic interfering waves have a frequency ≥30 MHz, is the shielding insufficient.

A shielding ring made of a soft magnetic material is, on the other hand, very well suited for shielding against electromagnetic interfering waves. Such shielding rings can effectively shield against even electromagnetic interfering waves such as occur in the field of e-mobility, viz., electromagnetic interfering waves with a frequency ≥30 MHz.

As a result of the soft magnetic materials used, which are ferromagnetic materials, the shielding ring is not electrically-conductive, in contrast to the potential equalization rings described above. As a result, such a shielding ring is unsuitable as potential equalization ring; the shielding ring has no task other than shielding against electromagnetic interfering waves.

According to an advantageous embodiment, it can be provided that the shielding ring be formed by a ferrite ring. Such a ferrite ring is virtually electrically non-conductive/electrically insulating. The ferrite ring can consist of sintered ceramic. The materials of which soft magnetic ferrite rings consist are generally known and are not the subject matter of the present invention.

Since soft magnetic ferrites, as described above, are electrically non-conductive/insulating, eddy current losses do not occur, and they are even well suited for shielding against electromagnetic interfering waves with high frequencies in the range ≥30 MHz.

Depending upon the respective conditions of the application—in particular, depending upon the frequency of the electromagnetic interfering waves to be shielded against, it may be provided that at least two shielding rings be arranged in a functional series connection.

Such a functional series connection can be achieved by the at least two shielding rings being arranged to be adjacent to one another in the axial direction and forming a pre-assemblable unit. The higher the number of shielding rings used is, the better the high-frequency, electromagnetic interfering waves are dampened.

The sealing ring can be designed as usual and consist of a conventional sealing material.

If the seal is not only, as described above, to seal and to be able to simultaneously shield against electromagnetic interfering waves by means of the shielding ring, but, additionally, as described at the outset, also provide for potential equalization, it may be provided that the sealing ring consist of an electrically-conductive sealing material. By means of the sealing ring made of electrically-conductive sealing material, different potentials between the machine elements to be sealed against one another can be compensated for, and voltage breakdowns and resulting damages to the machine elements to be sealed against one another can be avoided.

It may be provided, additionally or alternatively, for the seal to comprise, in addition to the sealing ring and the at least one shielding ring, at least one potential equalization ring made of an electrically-conductive material.

As stated at the outset, such a potential equalization ring can be formed by an air-permeable and electrically-conductive, non-woven ring. Alternatively, the potential equalization ring can consist of an electrically-conductive polymer material.

Depending upon the application, two potential equalization rings may, for example, be provided.

In the case of such a multifunctional seal, it is advantageous that it combines in itself three functions that differ fundamentally from one another. The sealing ring made of the sealing material ensures that two machine elements are reliably sealed against one another.

The shielding ring made of a soft magnetic material simultaneously ensures that electromagnetic interfering waves are effectively shielded against, even if the machine elements to be sealed against one another are to be used in connection with e-mobility, and electromagnetic interfering waves with a frequency ≥30 MHz are to be dampened.

In addition, a potential equalization function can be achieved either in that the sealing ring consists of an electrically-conductive sealing material or in that a potential equalization ring made of an electrically-conductive material is additionally used. In both cases, voltage breakdowns between the machine elements to be sealed against one another are then avoided.

A good effect of shielding ring and potential equalization can only be ensured if a strict functional separation is carried out. Because the shielding ring is electrically non-conductive/insulating, it is not suitable for potential equalization.

Conversely, a sealing ring made of an electrically-conductive sealing material cannot ensure an effective shielding against electromagnetic interfering waves—especially not when the electromagnetic interfering waves are at a high frequency, in a frequency range ≥30 MHz. A separately-produced potential equalization ring consisting of an electrically-conductive material is also not able to do so.

According to an advantageous embodiment, it can be provided that the at least one shielding ring and the potential equalization ring form a pre-assemblable unit. In this case, it is advantageous that the seal consists of few individual parts, thereby has a simple construction, and the risk of assembly errors is limited to a minimum.

Figure 2:
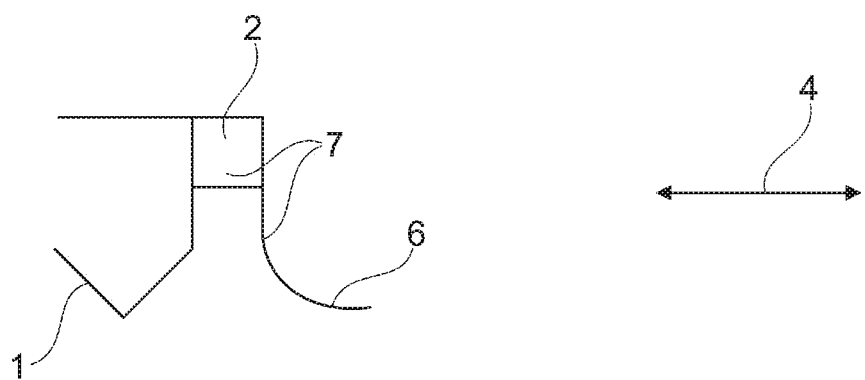
Figure 3:
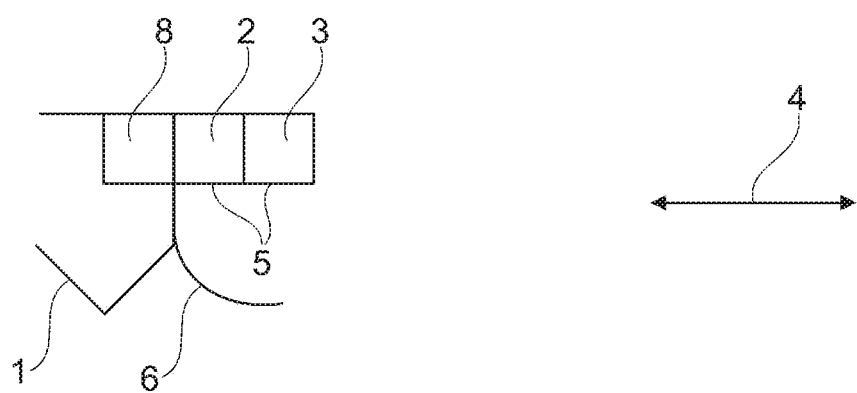

The seals of FIGS. 1 through 3 each comprise a sealing ring 1 which consists of a sealing material.

The sealing ring is used in the field of e-mobility for sealing two machine elements.

In addition to the sealing ring 1, the shielding ring 2 is used, which, in the exemplary embodiment shown here, is formed by a soft magnetic ferrite ring. The shielding ring shields against electromagnetic interfering waves; the shielding ring 2 does not have any other/additional task.

The illustrations shown in FIGS. 1 and 3 are only exemplary in each case.

It goes without saying that the shielding ring 2 may be arranged at a wide variety of points of the sealing ring 1 and may be connected to the sealing ring 1.

The shielding ring 2 is shown "outside" the sealing ring 1 on the side of the sealing ring 1 which axially faces away from a space to be sealed.

Depending upon the particular conditions of the application—particularly when the axial installation space for the seal is very limited—there is, however, the possibility of arranging the shielding ring 2 "inside" the sealing ring 1. Like the installation space of the shielding ring 8 of FIG. 3, the installation space of the shielding ring 2 would then be limited by the axial and radial legs of the sealing ring 1.

In FIG. 2, the seal comprises not only, as in FIG. 1, the sealing ring 1 and the shielding ring 2, but, additionally, a potential equalization ring 6 made of an electrically-conductive material. The functions, "sealing," "shielding from electromagnetic interfering waves," and "potential equalization," are combined in one seal.

The functional separation between shielding and potential equalization is critical. The shielding is effected by an electrically non-conductive/insulating, soft magnetic material; the potential equalization, on the other hand, is effected by an electrically-conductive material.

The functional separation results in the shielding ring and the potential equalization ring each being functionally individualized and optimally designed to perform their respective tasks.

FIG. 3 shows an exemplary embodiment, similar to the exemplary embodiments of FIG. 1 and FIG. 2, wherein two shielding rings 2, 3 arranged in a functional series connection are used.

The two shielding rings 2, 3 form a pre-assemblable first unit 5.

The pre-assemblable first unit 5 is arranged "outside," on the side of the sealing ring 1 axially facing away from a space to be sealed. In order to shield against electromagnetic interfering waves in an even better way, a further shielding ring 8 is additionally provided, which is arranged "inside" the sealing ring 1 in a functional series connection with the pre-assemblable first unit 5.

Also, a potential equalization ring 6 is a component of the seal shown, in order to avoid voltage breakdowns.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A seal for sealing a space between shaft and a housing, comprising:
    a sealing ring disposed between the shaft and the housing axially adjacent to the space, the sealing ring comprising a sealing material;
    at least one shielding ring comprising a soft magnetic material connected to the sealing ring one a side facing axially away from the space, the at least one shielding ring configured to shield against electromagnetic interfering waves; and
    a potential equalization ring comprising an electrically-conductive material, wherein the at least one shielding ring and the potential equalization ring form a pre-assemblable unit.

2. The seal according to claim 1, wherein the at least one shielding ring comprises a ferrite ring.

3. The seal according to claim 1, wherein the at least one shielding ring comprises at least two shielding rings, the at least two shielding rings being arranged in a functional series connection.

4. The seal according to claim 3, wherein the at least two shielding rings are arranged to be adjacent to one another in an axial direction and form a pre- assemblable first unit.

5. The seal according to claim 1, wherein the sealing ring comprises an electrically-conductive sealing material.

6. The seal according to claim 1, wherein the potential equalization ring comprises an air-permeable and electrically-conductive non-woven ring.

\* \* \* \* \*